(12) United States Patent
Wort et al.

(10) Patent No.: US 10,590,563 B2
(45) Date of Patent: Mar. 17, 2020

(54) METHOD OF FABRICATING A PLURALITY OF SINGLE CRYSTAL CVD SYNTHETIC DIAMONDS

(71) Applicant: ELEMENT SIX TECHNOLOGIES LIMITED, Didcot, Oxfordshire (GB)

(72) Inventors: Christopher John Howard Wort, Didcot (GB); Daniel James Twitchen, Didcot (GB); John Lloyd Collins, Didcot (GB)

(73) Assignee: Element Six Technologies Limited, Didcot, Oxfordshire (GB)

( * ) Notice: Subject to any disclaimer, the term of this patent is extended or adjusted under 35 U.S.C. 154(b) by 0 days.

(21) Appl. No.: 15/762,486

(22) PCT Filed: Sep. 14, 2016

(86) PCT No.: PCT/EP2016/071721
§ 371 (c)(1),
(2) Date: Mar. 22, 2018

(87) PCT Pub. No.: WO2017/050620
PCT Pub. Date: Mar. 30, 2017

(65) Prior Publication Data
US 2018/0266013 A1    Sep. 20, 2018

(30) Foreign Application Priority Data

Sep. 23, 2015 (GB) .................................. 1516814.9

(51) Int. Cl.
*C30B 25/00* (2006.01)
*C30B 25/20* (2006.01)
(Continued)

(52) U.S. Cl.
CPC ............ *C30B 25/20* (2013.01); *C23C 16/274* (2013.01); *C23C 16/279* (2013.01); *C30B 25/18* (2013.01); *C30B 25/186* (2013.01); *C30B 29/04* (2013.01)

(58) Field of Classification Search
CPC combination set(s) only.
See application file for complete search history.

(56) References Cited

U.S. PATENT DOCUMENTS 5,304,249 A * 4/1994 Chosa .................... C23C 16/274
                                                           118/728
2007/0034147 A1* 2/2007 Wort ........................ C30B 23/02
                                                           117/200
(Continued)

FOREIGN PATENT DOCUMENTS

GB    2486784 A    6/2012
GB    2492661 A    1/2013
(Continued)

OTHER PUBLICATIONS

Balmer, R.S., et al., "Chemical vapour deposition synthetic diamond: materials, technology and applications," Journal of Physics: Condensed Matter, 2009, pp. 1-23, vol. 21, No. 36, IOP Publishing Ltd., United Kingdom.
(Continued)

*Primary Examiner* — Erin F Bergner
(74) *Attorney, Agent, or Firm* — Dean W. Russell; Clark F. Weight; Kilpatrick Townsend & Stockton LLP

(57) ABSTRACT

A method of fabricating a plurality of single crystal CVD diamonds, the method comprising: coating a carrier substrate with a layer of polycrystalline CVD diamond material; bonding a plurality of single crystal diamond substrates to the layer of polycrystalline CVD diamond material on the carrier substrate; growing single crystal CVD diamond material on the plurality of single crystal diamond substrates
(Continued)

to form a plurality of single crystal CVD diamonds; and separating the plurality of single crystal CVD diamonds from the layer of polycrystalline CVD diamond material on the carrier substrate and any polycrystalline CVD diamond material which has grown between the plurality of single crystal CVD diamonds to yield a plurality of individual single crystal CVD diamonds.

11 Claims, 1 Drawing Sheet

(51) Int. Cl.
  *C30B 29/04* (2006.01)
  *C23C 16/27* (2006.01)
  *C30B 25/18* (2006.01)

(56) References Cited

U.S. PATENT DOCUMENTS

| | | | |
|---|---|---|---|
| 2012/0051996 A1* | 3/2012 | Scarsbrook | B82Y 10/00 423/446 |
| 2014/0097159 A1* | 4/2014 | Belnap | B23K 1/0008 219/85.22 |

FOREIGN PATENT DOCUMENTS

| | | | |
|---|---|---|---|
| JP | H05201795 A | | 8/1993 |
| RU | 2489532 C1 | | 8/2013 |
| WO | 0196633 A1 | | 12/2001 |
| WO | 0196634 A1 | | 12/2001 |
| WO | 03052174 A2 | | 6/2003 |
| WO | 03052177 A1 | | 6/2003 |
| WO | 2004046427 A1 | | 6/2004 |
| WO | 2005010245 A1 | | 2/2005 |
| WO | 2007066215 A2 | | 6/2007 |
| WO | 2010010344 A1 | | 1/2010 |
| WO | 2010010352 A1 | | 1/2010 |
| WO | 2011076643 A1 | | 6/2011 |
| WO | 2012084655 A2 | | 6/2012 |
| WO | 2012084657 A1 | | 6/2012 |
| WO | 2012084658 A1 | | 6/2012 |
| WO | 2012084659 A3 | | 6/2012 |
| WO | 2012084660 A1 | | 6/2012 |
| WO | 2012084661 A1 | | 6/2012 |
| WO | 2013087697 A1 | | 6/2013 |
| WO | 2014105085 A1 | | 7/2014 |

OTHER PUBLICATIONS

United Kingdom Patent Application No. GB 1516814.9, Combined Search and Examination Report dated Mar. 21, 2016 (5 pages).
United Kingdom Patent Application No. GB 1615630.9, Combined Search and Examination Report dated Feb. 24, 2017 (5 pages).
International Patent Application No. PCT/EP2016/071721, International Search Report and Written Opinion dated Nov. 23, 2016 (12 pages).
Yan, Chih-Shiue, et al., "Very high growth rate chemical vapor deposition of single-crystal diamond," Proceedings of the National Academy of Science, Oct. 1, 2002, pp. 12523-12525, vol. 99, No. 20, PNAS.

* cited by examiner

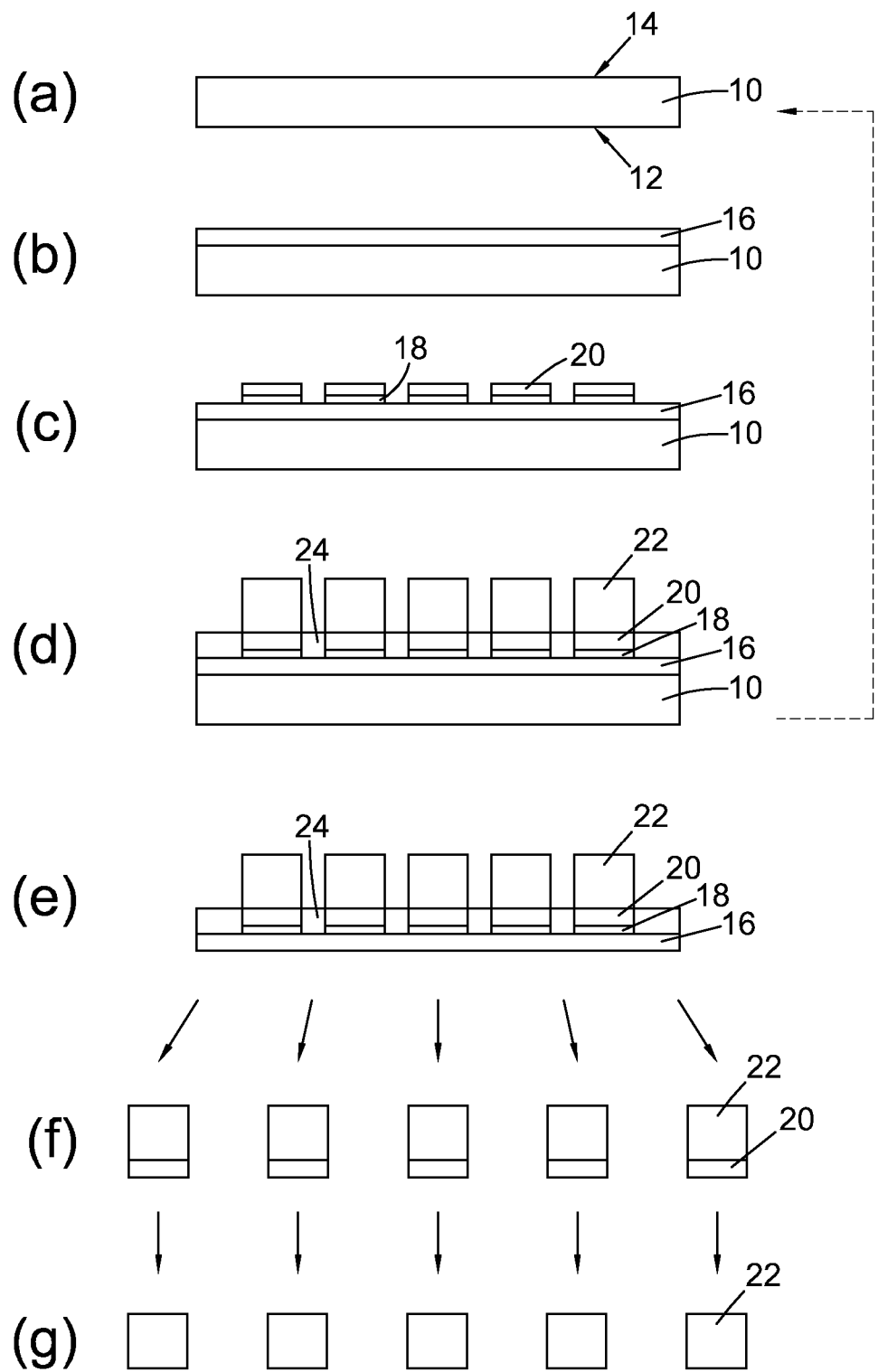

METHOD OF FABRICATING A PLURALITY OF SINGLE CRYSTAL CVD SYNTHETIC DIAMONDS

FIELD OF INVENTION

Embodiments of the present invention relate to a method of fabricating a plurality of single crystal CVD (chemical vapour deposited) synthetic diamonds.

BACKGROUND OF INVENTION

CVD processes for synthesis of diamond material are now well known in the art. Useful background information relating to the chemical vapour deposition of diamond materials may be found in a special issue of the Journal of Physics: Condensed Matter, Vol. 21, No. 36 (2009) which is dedicated to diamond related technology. For example, the review article by R. S Balmer et al. gives a comprehensive overview of CVD diamond materials, technology, and applications (see "Chemical vapour deposition synthetic diamond: materials, technology and applications" J. Phys.: Condensed Matter, Vol. 21, No. 36 (2009) 364221).

Being in the region where diamond is metastable compared to graphite, synthesis of diamond under CVD conditions is driven by surface kinetics and not bulk thermodynamics. Diamond synthesis by CVD is normally performed using a small fraction of carbon (typically <5%), typically in the form of methane although other carbon containing gases may be utilized, in an excess of molecular hydrogen. If molecular hydrogen is heated to temperatures in excess of 2000 K, there is a significant dissociation to atomic hydrogen. Various methods are available for heating carbon containing gas species and molecular hydrogen in order to generate the reactive carbon containing radicals and atomic hydrogen for CVD synthetic diamond growth including arc-jet, hot filament, DC arc, oxy-acetylene flame, and microwave plasma. Various aspects of a microwave plasma activated CVD reactor adapted for diamond synthesis are described in the patent literature including WO 2012/084657, WO 2012/084655, WO 2012/084658, WO 2012/084659, WO 2012/084660, and WO 2012/084661.

In the presence of a suitable substrate material, CVD synthetic diamond material can be deposited. Polycrystalline CVD diamond material may be formed on a non-diamond substrate, typically formed of a carbide forming material such as silicon, silicon carbide, or refractory metals such as molybdenum, tungsten, titanium, etc. Single crystal CVD synthetic diamond material may be formed by homoepitaxial growth on a single crystal diamond substrate. There are several advantages to single crystal CVD diamond material for certain applications due to the avoidance of grain boundaries, e.g. higher thermal conductivity for thermal heat spreading applications and lower scattering of light for certain optical applications. However, to date single crystal CVD diamond material is only available in relatively small sizes and thus for many applications polycrystalline CVD diamond components are still preferred, e.g. for large area optical windows and heat spreaders. It has also been proposed to combine the more extreme characteristics of single crystal CVD diamond material with large area polycrystalline CVD diamond wafers by providing composite wafers comprising a plurality of single crystal diamond substrates bonded to a polycrystalline CVD diamond carrier wafer. Such composite substrates are described in WO 2005/010245 and comprise a polycrystalline CVD diamond support layer and a plurality of single crystal diamond substrates fixed to the polycrystalline CVD diamond support layer. Device structures can then be fabricated on the plurality of single crystal diamond substrates. Various ways of bonding the single crystal diamond substrates to the polycrystalline CVD diamond support layer are described in WO 2005/010245 including the use of adhesives such as gluing or brazing. WO 2005/010245 also indicates that a preferred bonding method is direct diamond-to-diamond bonding by growing the polycrystalline CVD diamond support layer directly onto an array of single crystal diamond substrates. For example, WO 2005/010245 suggests that single crystal diamond substrates can be brazed to a backing wafer such as silicon, tungsten or polycrystalline diamond and a layer of polycrystalline CVD diamond grown thereon. Subsequently the backing wafer can be retained or removed, for example, to provide a polycrystalline CVD diamond wafer in which a plurality of single crystal diamond substrates are disposed with both surfaces of the single crystal diamond substrates exposed, e.g. to provide optical windows.

Having regard to single crystal CVD diamond growth, it is commercially advantageous to synthesize a plurality of single crystal CVD diamonds in a single growth run. A plurality of single crystal CVD synthetic diamonds can be fabricated in a single CVD growth run by providing a plurality of single crystal diamond substrates on a carrier substrate. The carrier substrate is typically formed of a carbide forming material such as silicon, silicon carbide, or refractory metals such as molybdenum, tungsten, titanium, etc. For example, the substrates can be placed on a refractory metal carrier substrate or bonded thereto by soldering or brazing. One problem with this approach to synthesizing a plurality of single crystal CVD diamonds is that of uniformity and yield. Non-uniformities can exist in terms of crystal morphology, growth rate, cracking, and impurity content and distribution. For example, as described in WO2013/087697, even if the CVD diamond growth chemistry is carefully controlled, non-uniform uptake of impurities can still occur due to temperature variations at the growth surface which affect the rate of impurity uptake. Variations in temperature also cause variations in crystal morphology, growth rate, and cracking issues. These temperature variations can be in a lateral direction relative to the growth direction at a particular point in the growth run (spatially distributed) or parallel to the growth direction due to variations in temperature over the duration of a growth run (temporally distributed). Variations can occur within a single CVD diamond stone and also from stone to stone in a multi-stone synthesis process. As such, in a multi-stone synthesis process only a portion of product diamond stones from a single growth run may meet a target specification. In this regard, WO2013/087697 discusses brazing of single crystal substrates to a refractory metal carrier substrate and some suitable braze alloys to obtain a good adhesion and thermal contact between the single crystal diamond substrates and the underlying refractory metal carrier substrate to improve uniformity and yield of single crystal CVD synthetic diamond product.

In addition to the above, contamination of the single crystal CVD diamond product stones can result as material from the carrier substrate is etched away and becomes incorporated into the single crystal CVD diamond material during growth. In this regard, it may be noted that impurities in the CVD processes are critical to the type of diamond material which is produced. For example, various impurities may be intentionally introduced into the CVD process gases, or intentionally excluded from the CVD process gases, in order to engineer a CVD synthetic diamond material for a particular application. Furthermore, the nature of the substrate material and the growth conditions can affect the type and distribution of defects incorporated into the CVD synthetic diamond material during growth. Patent literature describing various types of single crystal CVD diamond material and methods of fabrication include WO01/096633, WO01/096634, WO2004/046427, WO2007/066215, WO 2010010344, WO 2010010352, WO03/052174, WO2003/052177, WO2011/076643, and WO2013/087697.

In light of the above, it is clear that effective thermal management and control of impurities are thus key features to achieving uniform single crystal CVD diamond material at high yields according to a target specification. It is an aim of embodiments of the present invention to address these issues and provide an improved single crystal CVD diamond growth process.

SUMMARY OF INVENTION

As described in the background section, prior art such as WO2013/087697 suggests a single crystal CVD diamond growth process in which single crystal substrates are brazed onto to a refractory metal carrier substrate. Single crystal CVD diamond material is grown on the single crystal diamond substrates and then the single crystal CVD diamonds are removed from the carrier substrate. It is also indicated that thermal management is important and suitable braze alloys are disclosed to obtain good adhesion and thermal contact between the single crystal diamond substrates and the underlying refractory metal carrier substrate.

As is also described in the background section, WO 2005/010245 suggests that composite wafers comprising both polycrystalline and single crystal diamond can be fabricated by bonding single crystal diamond substrates to a backing wafer such as silicon, tungsten or polycrystalline diamond and growing a layer of polycrystalline CVD diamond thereon. WO 2005/010245 also notes that in such a process single crystal diamond material can grow over the single crystal diamond substrates with polycrystalline diamond material growing between the single crystal diamond substrates to bond them together. It is suggested that the growth conditions can be controlled such as to provide single crystal diamond on the front faces of the single crystal diamond substrates which is compatible with the end application for the composite wafer. Alternatively, it is suggested that the single crystal diamond material grown on the single crystal diamond substrates can be removed by polishing or single crystal diamond growth can be supressed by masking off the single crystal diamond substrates during CVD diamond overgrowth such that only polycrystalline CVD diamond grows between the single crystal diamond substrates.

While WO 2005/010245 describes bonding of single crystal diamond substrates to a polycrystalline diamond backing wafer and then overgrowth of diamond material to form a composite wafer comprising both polycrystalline and single crystal diamond, the present invention is concerned with the finding that the provision of a polycrystalline CVD diamond backing layer in a process for manufacturing a plurality of individual single crystal CVD diamonds is highly advantageous. That is, rather than bonding of single crystal diamond substrates to a refractory metal carrier substrate in a single crystal CVD diamond growth process as described, for example, in WO2013/087697, the single crystal diamond substrates are bonded to a polycrystalline CVD diamond backing layer similar to the approach disclosed in WO 2005/010245. However, contrary to WO 2005/010245 such an approach is used in a single crystal CVD diamond synthesis process in which the single crystal CVD diamonds are separated from the layer of polycrystalline CVD diamond material on the carrier substrate and any polycrystalline CVD diamond material which has grown between the plurality of single crystal CVD diamonds to yield a plurality of individual single crystal CVD diamonds. In this regard, it would seem counter-intuitive to provide a polycrystalline CVD diamond layer which is completely discarded during the final fabrication steps. However, it has been found that the provision of a layer of polycrystalline CVD diamond to which single crystal diamond substrates are bonded allows for better thermal management of the single crystal CVD diamond material grown on the substrates in a single crystal CVD diamond growth process. Furthermore, it has been found that the provision of a coating of polycrystalline CVD diamond material on the carrier substrate aids in preventing contamination of the single crystal CVD diamond material by material from the carrier substrate during growth. As such, after separating the single crystal CVD diamonds from the layer of polycrystalline CVD diamond material, a plurality of individual single crystal CVD diamonds are achieved which have a higher degree of uniformity according to a desired target specification when compared to previously described approaches.

Furthermore, after growth of the single crystal CVD synthetic diamond material on the substrates, the layer of polycrystalline CVD diamond material can be made to delaminate from the underlying carrier substrate which allows for easier extraction of the single crystal CVD synthetic diamond product and also allows re-use of the carrier substrate.

As such, a method of fabricating a plurality of single crystal CVD diamonds is described herein which comprises:
  coating a carrier substrate with a layer of polycrystalline CVD diamond material;
  bonding a plurality of single crystal diamond substrates to the layer of polycrystalline CVD diamond material on the carrier substrate;
  growing single crystal CVD diamond material on the plurality of single crystal diamond substrates to form a plurality of single crystal CVD diamonds; and
  separating the plurality of single crystal CVD diamonds from the layer of polycrystalline CVD diamond material on the carrier substrate and any polycrystalline CVD diamond material which has grown between the plurality of single crystal CVD diamonds to yield a plurality of individual single crystal CVD diamonds.

The layer of polycrystalline CVD diamond material can be coated onto the carrier substrate by direct CVD diamond growth on the carrier substrate. The plurality of single crystal diamond substrates can be bonded to the layer of polycrystalline CVD diamond material on the carrier substrate via brazing. The braze alloy is selected to provide a combination of good adhesion of the single crystal diamond substrates to the layer of polycrystalline CVD diamond material and also good thermal contact between the single crystal diamond substrates and the layer of polycrystalline CVD diamond material.

The growth of single crystal CVD diamond material on the plurality of single crystal diamond substrates is advantageously controlled such that a vertical growth rate of the single crystal CVD diamond material on the single crystal diamond substrates is higher than a vertical growth rate of polycrystalline CVD diamond material growing on the polycrystalline CVD diamond layer exposed between the single crystal diamond substrates. In contrast to WO 2005/010245, according to embodiments of the present invention a CVD diamond synthesis chemistry is selected to achieve high growth rates of single crystal CVD diamond on the single crystal diamond substrates rather than selecting a CVD diamond synthesis chemistry which achieves high growth rates of polycrystalline diamond growth between the single crystal diamond substrates. In this regard, a wide range of single crystal CVD diamond synthesis chemistries are known in the art for various types of single crystal CVD diamond material as indicated, for example, in the citations in the background section of this specification. The present synthesis methodology is applicable to this range of single crystal CVD diamond synthesis chemistries. A skilled person can select suitable growth conditions for the initial polycrystalline CVD diamond layer and for the single crystal CVD diamond growth to ensure that the polycrystalline diamond material does not overgrow the single crystal CVD diamonds during the single crystal CVD diamond growth stage.

The surface roughness of the carrier substrate and the thickness and texture of the polycrystalline CVD diamond layer on which the single crystal diamond substrates are bonded are selected and controlled to ensure that the layer of polycrystalline CVD diamond remains adhered to the carrier substrate both after fabrication and prior to single crystal substrate adhesion and also during single crystal CVD diamond growth. The surface roughness of the carrier substrate and the thickness and texture of the polycrystalline CVD diamond layer can also be selected and controlled to ensure that the layer of polycrystalline CVD diamond is readily removed from the carrier substrate after single crystal CVD diamond growth, e.g. via spontaneous delamination during a cooling step after single crystal CVD diamond growth. This allows easier extraction of the plurality of single crystal CVD diamond stones from the polycrystalline diamond layer. In addition, this allows the carrier substrate to be re-used, optionally with a re-processing step between uses or batches of uses. In addition, the thickness of the polycrystalline CVD diamond layer on which the single crystal CVD diamond substrates are bonded is advantageously kept relatively thin to minimize the additional time and expense of growing this layer which is then removed as waste material when the single crystal CVD diamonds are detached after growth. At the same time, the polycrystalline CVD diamond should be made sufficiently thick to provide efficient heat spreading and thermal management of the single crystal diamond material bonded thereto.

BRIEF DESCRIPTION OF THE DRAWINGS

For a better understanding of the present invention and to show how the same may be carried into effect, embodiments of the present invention will now be described by way of example only with reference to the accompanying drawings, in which:

FIGS. 1(a) to (g) illustrate the steps of a method of fabricating a plurality of single crystal CVD diamonds according to an embodiment of the present invention.

DETAILED DESCRIPTION

As an initial step in the present single crystal CVD diamond synthesis process a carrier substrate 10 is provided as illustrated in FIG. 1(a). Suitable materials for the carrier substrate include carbide forming materials such as silicon, silicon carbide, or refractory metals such as molybdenum, tungsten, titanium, etc. The carrier substrate is typically in the form of a cylindrical disk which is processed to a high degree of flatness and parallelism between opposing major faces 12, 14 of the disk. A growth face 14 of the carrier substrate is processed to a controlled surface roughness. Typical parameters for the carrier substrate include one, more, or all of the following:

a diameter in a range 30 mm to 200 mm, optionally 50 mm to 120 mm;

a thickness in a range 1.5 mm to 20 mm, 3 mm to 20 mm, optionally 5 mm to 10 mm (thickness is generally scaled with diameter, e.g. a 50 mm diameter carrier may have a thickness of approximately 5 mm whereas a 120 mm diameter carrier may have a thickness of approximately 10 mm);

a surface roughness $R_a$ of typically less than 5 µm, 2 µm, or 1 µm, and more typically in a range 0.05 µm to 0.3 µm, optionally 0.1 µm to 0.2 µm; and a surface flatness with a height variation of no more than 20 µm, optionally no more than 10 µm or no more than 5 µm (again this is generally scaled with carrier diameter).

As an alternative to the use of a flat carrier substrate, the carrier could comprise a recessed surface, a curved surface (e.g. partially domed with flat portions for mounting of single crystal diamond substrates thereon), or comprise a pedestal.

Once suitably prepared, the carrier substrate is mounting in a CVD reactor and a layer of polycrystalline CVD diamond material 16 is grown on the growth face of the carrier substrate 10 as illustrated in FIG. 1(b). The surface roughness of the carrier substrate in combination with the growth conditions used to form the coating of polycrystalline CVD diamond material are important to ensure the correct degree of adhesion between the carrier substrate and the layer of polycrystalline CVD diamond material. In particular, the surface roughness of the carrier substrate along with the thickness and texture of the layer of polycrystalline CVD diamond material grown thereon are selected and controlled to ensure that the layer of polycrystalline CVD diamond remains adhered to the carrier substrate on cool down after fabrication of the polycrystalline CVD diamond layer and also during subsequent single crystal CVD diamond growth as described below. In addition, the bonding between the carrier substrate and the polycrystalline CVD diamond layer is advantageously sufficiently weak that on cool down after the single crystal CVD diamond growth process the layer of polycrystalline CVD diamond delaminates from the carrier substrate. Typical parameters for the layer of polycrystalline CVD diamond material include a thickness in a range 20 µm to 200 µm, optionally 50 µm to 100 µm, or 50 µm to 80 µm. Growing a thicker layer will also provide a larger surface grain size. Thickness uniformity should also be controlled, e.g. by providing a uniform plasma over the growth surface area using synthesis technology as described in the background section of this specification.

Factors relating to the polycrystalline CVD diamond layer include the following:

i. A growth temperature higher than the growth temperature used for subsequent single crystal CVD diamond growth to aid in minimizing thermally induced stress on cool down and re-heating for the single crystal CVD diamond growth stage.

ii. The polycrystalline CVD diamond layer is particularly important when a single crystal diamond substrate etch is utilized prior to single crystal CVD diamond growth.

iii. The polycrystalline CVD diamond growth temperature is ideally in excess of or similar to the single crystal diamond bonding (braze) temperature for same reason as (i), i.e. to minimize thermally induced strain.

iv. The texture of the polycrystalline CVD diamond is ideally not a similar alpha (actually 1/alpha) morphology to the single crystal CVD diamond morphology to minimize polycrystalline diamond competition and strain in the growing single crystal CVD diamond material.

v. The polycrystalline diamond layer thickness (and braze) in part helps manage the CTE mismatch between the carrier substrate and the single crystal CVD diamond material to avoid thermally induced mechanical strain and to enable thinner single crystal diamond substrates to be used without significant cracking.

vi. An upper thickness for the polycrystalline CVD diamond layer is determined by:
  1. The surface roughness of the carrier substrate—if the polycrystalline diamond layer is grown too thick for a given carrier substrate roughness then the intrinsic stresses in the polycrystalline diamond can lead to delamination of the polycrystalline diamond layer from the carrier substrate.
  2. Cost and time.

The polycrystalline CVD diamond layer may also be surface processed after growth.

An example of suitable growth conditions for fabricating the polycrystalline CVD diamond layer is as follows:
  $H_2$=500 to 4000 sccm (Standard Cubic Centimetres per Minute);
  $CH_4$=20 to 100 sccm;
  Ar=10 to 50 sccm;
  Substrate Temperature=1000 to 1200° C.;
  Microwave Power=3 to 30 kW;
  Pressure=100 to 300 Torr (13 to 40 kilopascal); and
  Carrier substrate diameter=30 mm to 200 mm.

After growth of the layer of polycrystalline CVD diamond the diamond coated carrier substrate is removed from the CVD reactor. A plurality of single crystal diamond substrates are bonded to the layer of polycrystalline CVD diamond material on the carrier substrate using a braze alloy. Details of the process for mounting the single crystal diamond substrates on the diamond coated carrier substrate are as follows:
  braze "pads" of a braze alloy (e.g. in the form of a foil, paste, or powder, typically square in shape and including compositions comprising one or more of gold, tantalum, palladium, and/or titanium such as TiCuAg, Pd/Au/Ti, Au/Ta or similar) are individually laid out on a polycrystalline diamond coated carrier substrate and single crystal diamond substrates placed on top of the braze pads (e.g. in a concentric configuration);
  the assembly is mounted in a vacuum chamber and heated by induction heating in a reducing atmosphere ($H_2$/Ar gas mix) at sub-atmospheric pressure using a pyrometer to monitor carrier temperature;
  temperature ramp-up/ramp-down is controlled to ensure uniformity of the process and reduce thermal shock due to thermal expansion coefficient mismatch between diamond and the braze alloy;
  when the temperature exceeds the melting point of the braze (1064° C. for Au) it melts and flows in such a way as to produce a uniform layer of braze material between the polycrystalline diamond layer and each of the single crystal diamond substrates.

The aforementioned process ensures uniform mechanical and thermal properties of the braze layer. Too much braze and it can flow/wet up the sides of the substrate and onto the growth surface. Cleanliness of the braze is also important to achieve good braze uniformity.

The resultant structure is illustrated in FIG. 1(c) and comprises the carrier substrate 10, the polycrystalline CVD diamond coating 16, and a plurality of single crystal diamond substrates 20 bonded to the polycrystalline CVD diamond coating 16 via braze bonds 18. The bonding between the single crystal diamond substrates and the layer of polycrystalline CVD diamond material has uniform mechanical and thermal properties for subsequent single crystal CVD diamond growth over the substrates. Furthermore, it is possible to bond a large number of single crystal diamond substrates using this configuration, e.g. >5, >10, >20, >50, >90, >100, or >150, optionally less than 500 and/or such that the single crystal diamond substrates cover at least 10, 20, 30, 40, 50, 60, or 70% of the upper surface of the carrier substrate, optionally less than 90%.

After preparation of the composite substrate structure as illustrated in FIG. 1(c), the composite substrate structure is re-loaded into a CVD reactor and subjected to a single crystal CVD diamond growth process. A wide range of single crystal CVD diamond materials and associated growth conditions are known in the art including high purity processes, nitrogen doping processes, boron doping processes, co-doping processes, and layered single crystal CVD diamond growth processes. After single crystal CVD diamond growth a structure as illustrated in FIG. 1(d) is formed which comprises the carrier substrate 10, the polycrystalline CVD diamond coating 16, the plurality of single crystal diamond substrates 20 bonded to the polycrystalline CVD diamond coating 16 via braze bonds 18, and a plurality of single crystal CVD diamonds 22 disposed on the single crystal diamond substrates 20. Single crystal CVD diamond growth processes generally use CVD growth parameters which favour single crystal CVD diamond growth. As such, growth of the single crystal CVD diamond material on the plurality of single crystal diamond substrates is controlled in this process such that a vertical growth of the single crystal CVD diamond material on the single crystal diamond substrates is higher than a vertical growth of polycrystalline CVD diamond material growing on the polycrystalline CVD diamond layer exposed between the single crystal diamond substrates. Inevitably, there will be some degree of polycrystalline CVD diamond growth 24 between the single crystal diamond substrates. However, growth conditions may be selected to ensure that the polycrystalline CVD diamond material does not overgrow the single crystal CVD diamond material or otherwise compete with the single crystal CVD diamond growth. For example, according to certain examples the polycrystalline CVD diamond layer is grown at a temperature over 1000° C. and the single crystal CVD diamonds are grown at a temperature under 1000° C. Using different growth regimes for the polycrystalline CVD diamond layer and the single crystal CVD diamonds aids in ensuring that the polycrystalline CVD diamond material does not unduly compete with the single crystal CVD diamond growth.

While it is advantageous for growth conditions to be such that the vertical growth rate of the single crystal CVD diamond material is higher than that of the polycrystalline CVD diamond material, for certain low growth rate single crystal diamond materials the growth rate of the single crystal CVD diamond may be marginally lower than that of the polycrystalline CVD diamond material. This is permissible as the single crystal diamond substrates mounted on the polycrystalline CVD diamond layer ensure that the single crystal CVD diamond material grown thereon is initially located higher than the polycrystalline CVD diamond layer. As such, a thin single crystal CVD diamond layer can be grown thereon which has a slower growth rate than the polycrystalline CVD diamond material before the polycrystalline CVD diamond material catches up with the single crystal CVD diamond. For example, a ratio of the single crystal CVD diamond growth rate to the polycrystalline CVD diamond growth rate may be >0.5, >0.75, >1.0, >1.5, >1.75, or >2.

After growth of the single crystal CVD diamonds 22 the growth run is terminated. Advantageously, the composite structure as illustrated in FIG. 1(d) is cooled down at a rate which is sufficient to spontaneously delaminate the polycrystalline CVD diamond layer 16 from the carrier substrate 10 to form the free-standing diamond composite structure illustrated in FIG. 1(e). If spontaneous delamination does not occur then the carrier substrate 10 can be separated by suitable mechanical means.

It is advantageous that there is some level of polycrystalline CVD diamond growth between the substrates during single crystal CVD diamond growth on the substrates as this can aid in achieving spontaneous delamination of the polycrystalline CVD diamond layer from the underlying carrier substrate during cooling after the single crystal CVD diamond growth step. For example:
  a suitable carrier substrate roughness is provided and a polycrystalline CVD diamond layer is grown thereon to a suitable initial thickness such that the layer remains adhered to the carrier substrate on cool down, i.e. thermally generated stress on cooling is relatively low due to the provision of a relatively thin layer and thus remains adhered;
  then, during the single crystal CVD diamond growth step, the layer of polycrystalline CVD diamond grows thicker but remains adhered to the carrier substrate due to the selected roughness of carrier substrate; and
  finally during cooling after the single crystal growth step, the thicker layer of polycrystalline CVD diamond generates a higher degree of thermally induced stress than the initial thin layer of polycrystalline CVD diamond and leads to spontaneous delamination of the polycrystalline CVD diamond layer from the carrier substrate on cooling after the single crystal growth step.

Advantageously, the braze bonds 18 also spontaneously fracture on cooling such that the single crystal CVD diamonds 22 can simply be lifted off the polycrystalline CVD diamond layer. Alternatively, the single crystal CVD diamonds can be extracted by mechanical means or laser cutting after removal of the carrier substrate 10. The layer of polycrystalline CVD diamond material 22 is usually removed from the carrier substrate 10 prior to separating the plurality of single crystal CVD diamonds from the layer of polycrystalline CVD diamond material. The carrier substrate 10 can then be re-prepared for further use and recycled to step (a) as illustrated by the dashed line in FIG. 1.

After extraction of the single crystals CVD diamonds 22 the single crystal diamond substrates 20 are still adhered as illustrated in FIG. 1(f). The single crystal diamond substrates 20 can be retained on the single crystals CVD diamonds 22 for certain applications. For other applications where the entire single crystal diamond must be of the type formed by the single crystal CVD diamond material then the substrates 20 can be removed by, for example, laser cutting to yield single crystal CVD diamonds 22 as illustrated in FIG. 1(g). These can then be further processed according to the desired end application. For example, the single crystal CVD diamonds can be sliced into plates, processed into lenses, prisms, or mechanical tool parts, or cut into gemstones for jewellery applications.

A key advantage of the present synthesis methodology is that the resultant single crystal CVD diamonds are highly uniform in terms of parameters such as the a growth parameter, thickness uniformity, and material quality uniformity. For example, the plurality of individual single crystal CVD diamonds may have a variation in the a growth parameter of <1, <0.5, <0.3, <0.2, or <0.1.

While this invention has been particularly shown and described with reference to embodiments, it will be understood to those skilled in the art that various changes in form and detail may be made without departing from the scope of the invention as defined by the appending claims.

The invention claimed is:

1. A method of fabricating a plurality of single crystal CVD diamonds, the method comprising:
  providing a carrier substrate made of a material capable of forming a carbide, wherein the carrier substrate has a thickness in a range 3 mm to 20 mm;
  coating the carrier substrate with a layer of polycrystalline CVD diamond material, wherein the layer of polycrystalline CVD diamond formed on the carrier substrate has a thickness in a range 20 µm to 200 µm;
  bonding a plurality of single crystal diamond substrates to the layer of polycrystalline CVD diamond material on the carrier substrate;
  growing single crystal CVD diamond material on the plurality of single crystal diamond substrates to form a plurality of single crystal CVD diamonds; and
  separating the plurality of single crystal CVD diamonds from the layer of polycrystalline CVD diamond material on the carrier substrate and any polycrystalline CVD diamond material which has grown between the plurality of single crystal CVD diamonds to yield a plurality of individual single crystal CVD diamonds.

2. A method according to claim 1, wherein a surface roughness of the carrier substrate and a thickness and texture of the layer of polycrystalline CVD diamond material grown thereon are selected and controlled to ensure that the layer of polycrystalline CVD diamond remains adhered to the carrier substrate on cool down after fabrication of the polycrystalline CVD diamond layer and also during single crystal CVD diamond growth after bonding of the plurality of single crystal diamond substrates to the layer of polycrystalline CVD diamond material on the carrier substrate.

3. A method according to claim 1, wherein the carrier substrate has a diameter in a range 30 mm to 200 mm.

4. A method according to claim 1, wherein the carrier substrate has a surface roughness in a range 0.05 µm to 0.3 µm.

5. A method according to claim 1, wherein the carrier substrate has a surface flatness with a height variation of no more than 20 µm.

6. A method according to claim 1, wherein the thickness of the layer of polycrystalline CVD diamond formed on the carrier substrate is in a range 50 µm to 100 µm.

7. A method according to claim 1, wherein the plurality of single crystal diamond substrates are bonded to the layer of polycrystalline CVD diamond material on the carrier substrate via brazing or soldering using a braze or solder.

8. A method according to claim 7, wherein the bonding between the single crystal diamond substrates and the layer of polycrystalline CVD diamond material is achieved by heating in a reducing atmosphere.

9. A method according to claim 8, wherein the heating is achieved by induction heating.

10. A method according to claim 1, wherein the layer of polycrystalline CVD diamond material is grown at a temperature over 1000° C. and the single crystal CVD diamonds are grown at a temperature under 1000° C.

11. A method according to claim 1, wherein the layer of polycrystalline CVD diamond material is removed from the carrier substrate prior to separating the plurality of single crystal CVD diamonds from the layer of polycrystalline CVD diamond material.

* * * * *